May 10, 1966 D. J. SHOMBERT ET AL 3,251,004

RELAXATION OSCILLATOR SEMICONDUCTOR SOLID CIRCUIT STRUCTURE

Original Filed April 27, 1961 2 Sheets-Sheet 2

United States Patent Office 3,251,004

Patented May 10, 1966

3,251,004
RELAXATION OSCILLATOR SEMICONDUCTOR SOLID CIRCUIT STRUCTURE

Donald J. Shombert, Berkeley Heights, and John E. Allegretti, East Brunswick, N.J., assignors to Merck & Co., Inc., Rahway, N.J., a corporation of New Jersey Original application Apr. 27, 1961, Ser. No. 106,016. Divided and this application Mar. 9, 1964, Ser. No. 350,948

5 Claims. (Cl. 331—107)

This invention relates to semiconductor devices and more particularly to miniaturized semiconductor solid circuit structures.

This application is a division of application Serial Number 106,016 filed April 27, 1961.

A great deal of effort has been expended in the prior art to accomplish micro-miniaturization of electrical and electronic circuits for use in various applications. Most of this effort has been directed to the development of various processes whereby the physical size of passive electrical components, such as resistors, capacitors, and inductors, might be reduced. Typically, such components along with electrical connections to them are deposited through masks upon circuit boards and thereafter active circuit elements, such as transistors, diodes and the like, are connected to the circuit boards to complete the desired circuit. Under such typical circumstances, the active circuit elements are housed in their normally accepted packages and they thus become the largest physical components in the micro-miniaturized circuit.

It can, therefore, be seen that although the present techniques of depositing passive circuit elements and electrical interconnections has reduced the size, space and weight required for a given circuit, the prior art active circuit elements have placed a definite limitation upon further reduction of such a nature. This limitation results from the active circuit element being incompatible with the passive circuit component forming techniques at least to the extent that the active circuit elements and passive circuit elements are separately formed and then brought together as a completed circuit.

A new approach to the preparation of micro-circuits is the formation of a layered structure of semiconductor material of predetermined conductivity type and degree. By this technique the semiconductor layers may be formed so that they contain a number of active and passive semiconductor devices at prescribed locations in the structure. Generally, such a structure is formed as a solid piece of semiconductor material which then must be cut in a predetermined manner in order to physically isolate active and passive regions from one to another. In an improved fabrication of microcircuits from layered semiconductor structures, therefore, it is highly desirable to reduce the number of cutting operations to a minimum so that the resultant circuit may be produced more economically and with greater strength and durability. Such an approach often leads to the occurrence of extraneous active devices in the solid circuit structure present as a result of coincidental interaction between one or more contiguous layers.

Accordingly, it is an object of the present invention to provide a semiconductor solid circuit structure including a plurality of layers of semiconductor material formed to function as a plurality of semiconductor devices in the circuit in an operative relationship.

Another object of the instant invention is to provide such a structure wherein one or more layers are utilized to prevent extraneous interaction between a plurality of contiguous layers.

A further object of this invention is to provide a semiconductor solid circuit structure which will operate as an improved relaxation oscillator.

A more specific object of the invention is to provide relaxation oscillator semiconductor solid circuit structure wherein a linear saw-toothed output wave-form is obtained.

Still another object is to provide a circuit as described above wherein there is provided means for modulating the output frequency of the circuit.

Among the other objects of the invention is to provide a relaxation oscillator semiconductor solid circuit structure including layers of semiconductor material capable of functioning as a capacitor, resistor and switch in contiguous relationship with a base member of semiconductor material, all of said layers being formed by growth from the vapor phase.

Other objects and advantages of the present invention, both as to its reaction and operation, will become apparent from consideration of the following description taken in conjunction with the accompanying drawings which are presented by way of example only and are not intended as a limitation upon the scope of the present invention.

In accordance with the present invention, there is provided a semiconductor solid circuit structure which includes a number of layers of semiconductor material forming thereby active and passive semiconductor devices. In a portion of said circuit there are present active devices in contiguous physical relationship with layers having prescribed physical characteristics which function to prevent extraneous interaction between these devices and layers contiguous therewith. According to a feature of the invention, the properties of such layers whereby such a function is achieved include a relatively high thickness in comparison to the diffusion length of minority carriers in the layer.

For purposes of clarity of description only, the present invention has been illustrated throughout the drawings in as schematic a representation as is possible so that the principles of the present invention may be clearly understood without obscuring them with details of description and illustartion well known to those skilled in the art. To this end, therefore, it will be readily apparent to those skilled in the art that the dimensions of the device illustrated have been greatly exaggerated for clarity. Furthermore, and for purposes of example only, simple circuits have been chosen as being typical structures which may be constructed in accordance with the principles of the present invention. It should be expressly understood, however, that any circuit which is desired, irrespective of complexity, may be constructed in accordance with the principles of the present invention limited only by the needs of the designer.

The features of the invention are illustrated herein, therefore, with reference to a relaxation oscillator solid circuit structure wherein a more linear output wave characteristic is obtained and wherein there is provided a means of modulating the output frequency with a light input.

Figure 1:
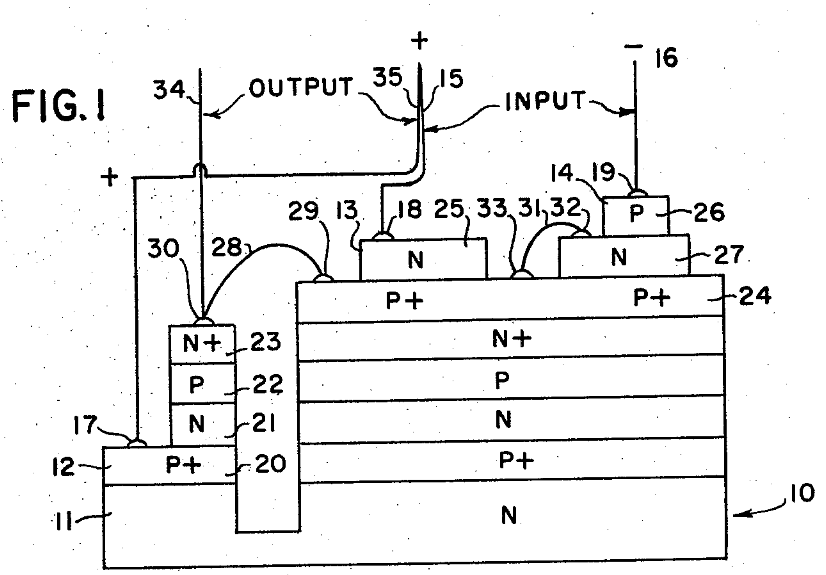
FIGURE 1 is a schematic representation of a semiconductor solid circuit structure in accordance with the present invention.
Figure 2:
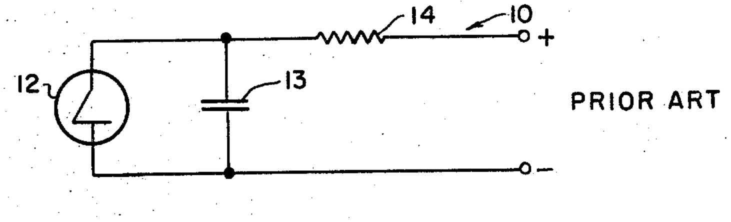
FIGURE 2 is an electrical schematic of the circuit structure of FIGURE 1.

Referring now to the drawings, FIGURE 1 is a schematic representation of one form of a physical embodiment of a circuit structure in accordance with the principles of the present invention while FIGURE 2 is a schematic circuit diagram of the circuit structure illustrated in FIGURE 1. The same reference numerals have been utilized in both FIGURES 1 and 2 for purposes of ready comparison of the structure of FIGURE 1 to the schematic circuit diagram of FIGURE 2.

The circuit structure as illustrated in FIGURE 1, and which is representative of the principles of the present invention, is designated generally at 10. It can be seen that the circuit structure of FIGURE 1 is comprised of several active semiconductor devices and passive circuit components all of which are combined to form a solid circuit structure. The solid circuit structure 10 includes a substantially single crystalline semiconductor material base member 11 to which there is crystallographically affixed active circuit elements, such as switch 12, diode capacitor 13 and diode resistor 14. Input terminals 15 and 16 are affixed by way of ohmic contacts 18 and 19, at respectively, switch 12 and diodes 13 and 14.

Switch 12 is composed of four layers of single crystalline semiconductor material 20, 21, 22 and 23 forming a P-N-P-N switch. Diode 13 is formed from layers of single crystalline semiconductor material 24 and 25, and diode 14 from similar material in layers 26 and 27. Each of the devices contain regions of semiconductor material of predetermined conductivity type separated by a transition region as is indicated by the conductivity determining letters N and P placed within the regions of each of the layers.

The devices are electrically interconnected in the following manner. The P-type region of diode 13 is connected to the N-type region of diode 14 by attaching a lead 31 from ohmic contact 33 on diode 13 to ohmic contact 32 on diode 14. The exterior N-type region of switch 12 is then connected to the P-type region of diode 13 by attaching lead 28 from ohmic contact 30 on switch 12 to ohmic contact 29 on diode 13. Output terminals 34 and 35, the latter corresponding to input terminal 15, are then affixed across switch 12 by ohmic contacts 30 and 17, respectively. Proper voltage bias is then provided to bias diodes 13 and 14 in a reverse direction to provide a capacitor device and a resistor device, respectively, in the circuit.

The schematic circuit diagram of FIGURE 2 should make it apparent to those skilled in the art that the solid circuit structure of FIGURE 1 represents a simple relaxation oscillator. With such a structure, when a D.C. input appears across the input terminals 15 and 16, an output signal will be produced at the output terminals 34 and 35.

Figure 3:
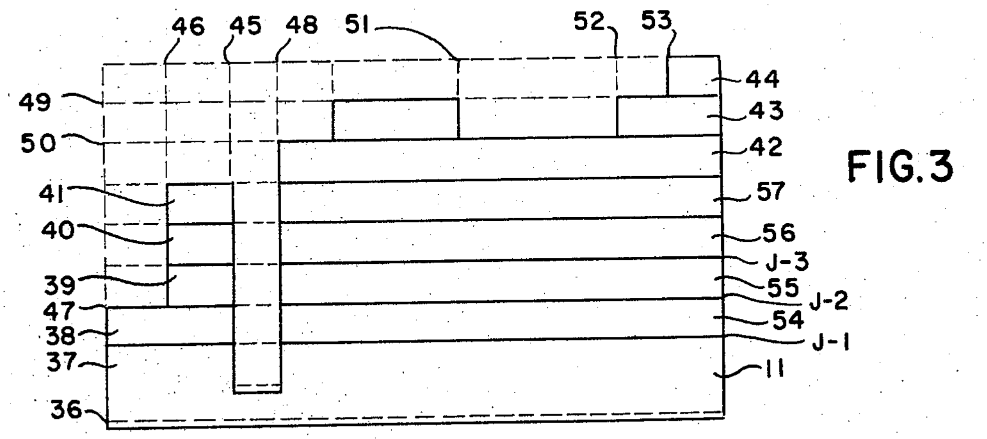
FIGURE 3 is an illustration showing the manner in which the structure of the type illustrated in FIGURE 1 is produced.

One method of constructing the circuit of the type illustrated in FIGURE 1 will now be described in conjunction with FIGURE 3 to which reference is hereby made. As is illustrated in FIGURE 3, there is provided a substrate 36 which is preferably of substantially single crystalline semiconductor material. For purposes of the following description, it will be asumed that the substrate and subsequent semiconductor material utilized to construct a solid circuit structure in accordance with the principles of the present invention, is a silicon semiconductor material.. It should, however, be expressly understood that a solid circuit structure in accordance with the present invention may be made from any semicoductor material which is desired. For example, silicon, germanium, silicon-germanium alloy, silicon-carbide, Group III-V intermetallic compounds, such as gallium-arsenide, indium-phosphide, aluminum-antimonide, indium antimonide and the like.

Upon the substrate 36 there is deposited a layer 37 of substantially single crystalline silicon. The combination of the substrate 36 and the layer 37 provides the base member as illustrated at 11 in FIGURE 1. Although the base member may have any desired conductivity type and any resistivity which is desired in accordance with a particular application to which a solid circuit structure in accordance with the present invention is put, for purposes of example, in constructing the solid circuit structure as illustrated in FIGURE 1, it is preferable that the base 11 be N-type silicon having a resistivity on the order of 100 ohm-cm. The layer 37 of N-type high resistivity silicon single crystalline material may be deposited to any desired thickness. The only criterion is that the base consisting of the substrate 36 and layer 37 provide physical support and electrical isolation for the remainder of the structure and it has been found that a thickness of approximately one millimeter is adequate for most solid circuit structures.

The layers 37 and 38, may be deposited in any manner known to the art. However, it is preferable that the layers 37 and 38 along with the remaining layers of material which will be discussed more in detail below, be deposited in a manner in which silicon semiconductor material along with a first predetermined concentration of active impurity is deposited upon a heated essentially single crystalline semiconductor starting element, such as the substrate illustrated at 36 in FIGURE 3, from a decomposable source thereof in a reaction chamber. After a predetermined period of time during which the desired thickness of semiconductor material has been deposited, for example, the layer 37 which forms part of the base member, the reaction chamber is flushed with gas to remove unwanted atoms of active impurity material therefrom. Thereafter, additional semiconductor decomposable source material and atoms of active impurity material of the desired type and of a second predetermined concentration are introduced into the reaction chamber and an additional layer of desired thickness of semiconductor silicon material is deposited in essentially single crystalline form contiguous with the layer of material previously deposited, such as, for example, the P+ layer 38 which is contiguous with the N-type 37 as illustrated in FIGURE 3. After the layer 38 of P+ type silicon semiconductor material has been deposited to the desired thickness, layers 39, 40, and 41 of N, P and N-type silicon semiconductor material, respectively, are deposited to form the remaining layers of switch 12. Typically, layers 39 and 40 each have a resistivity of 0.5 ohm-cm. and a thickness of 2 mils. Layer 41 has a resistivity of .01 ohm-cm. and a thickness which is large as compared to the other layers in the structure, generally about 12 mils, or greater. A thick layer 41 serves to facilitate location of the layer during cutting operations whereby certain active devices are physically isolated from each other. After the layer 41 of N+ type silicon has been deposited to the desired thickness, an additional layer 42 of semiconductor material is then deposited. The layer 42 is a P+ layer of resistivity .01 ohm-cm. and a thickness of about 5 mils. Thereafter layer 44 is formed of N type silicon of 1 ohm-cm. resistivity and a thickness of 2 mils. Finally, layer 44 of P-type silicon having a resistivity of 10 ohm-cm. and a thickness of 1 mil is formed.

After the various layers which form the solid structure have been thus formed by the deposition of single crystal silicon semiconductor material, the decomposable source of semiconductor material is then purged from the reaction chamber, and the structure is removed from the chamber. At this point the solid circuit structure is cut with a diamond saw. As is clearly illustrated in FIGURE 3, a saw cut 45 goes through each layer starting at the top and ending with the substrate layer thus physically isolating the switch 12 from the remaining portion of the circuit. The saw cut 46 goes through each of the layers and up to the bottom layer of switch 12. Additional saw cuts 47 through 53 are then made to complete the structure. The entire structure at this point is then etched in accordance with well-known techniques to remove damage which has been imparted by the saw cuts and to provide a proper surface for the various semiconductor devices. At this point, a solid semiconductor device including one switch and two diodes is provided. The various interconnections and bias requirements described in conjunction with the structure illustrated in FIGURE 1 are then placed directly upon the solid structure as illustrated in FIGURE 3. The interconnections may be made in accordance with well-known photographic masking techniques in conjunction with deposition of resistive and capacitive materials and electrical leads along with the proper insulation. In this manner, the various passive circuit components and the interconnections between them and the semiconductor devices are provided. It can be seen that in this manner there is provided a plurality of semiconductor devices crystallographically interconnected to a base member of semiconductor material including a P-N-P-N switch, a capacitor diode and a resistor diode interconnected to a base member of semiconductor material.

Electrical isolation is obtained not only by the various saw cuts which physically separate the devices but also by applying the proper biasing to the various devices, for example, by biasing the layers 54 through 57 with a negative potential with respect to the substrate layer 36. This causes the junctions J–1, J–2, J–3 as illustrated in FIGURE 3 to become reversed biased, thereby providing a high resistivity path between switch 12 and capacitor 13 and between switch 12 and resistor 14, since many reversed-biased diodes must be traversed in going from one active region of the structure to another through base 11. This, therefore, provides electrical isolation via the base member of the structure.

As another feature of the solid circuit structure of the present invention, layer 57 is provided with a predetermined thickness to prevent undesirable interaction therethrough between contiguous layers of the structure. Specifically, for example, P-N-P layers 42, 57 and 56, respectively, are prevented from acting as a transistor by the predetermined physical characteristics of layer 57 as hereinafter defined. Layer 57 is made very thick, in an order of magnitude greater than the diffusion length of minority carriers in the layer. A thickness of 2 mils for material having a lifetime of 1 microsec. or about 20 mils for material having a lifetime of 100 microsec. or greater is sufficient to prevent carriers from traversing the region. Alternatively, this layer may be heavily doped with abundance of majority carrier lifetime killers in the layer thereby to further assisting in preventing minority carries from traversing the dimensions of the layer within their lifetime.

Figure 4:
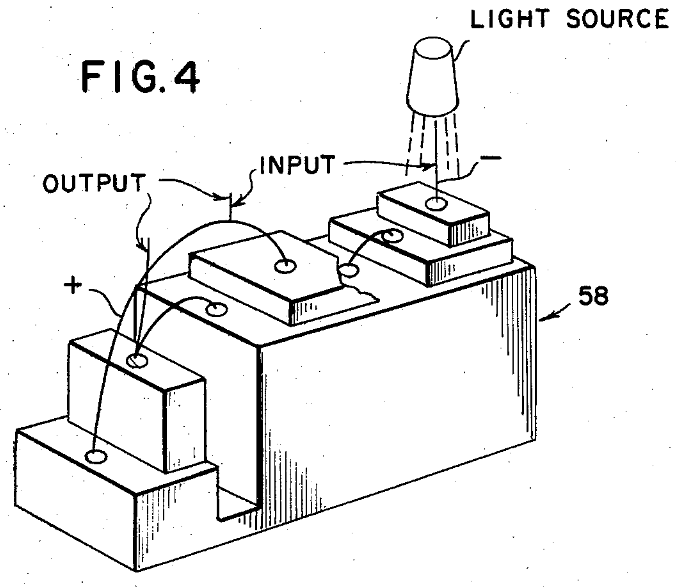
FIGURE 4 is a view in perspective of the structure of FIGURE 1.

After carrying out the various operations above briefly described, the input and output terminals along with the biasing terminals may be connected to the required points to provide a solid circuit structure which is capable of performing a desired function as a completed unit. A perspective view of the completed solid circuit 58 structure is shown in FIGURE 4. The structure may then be encapsulated in a manner known in the art to provide a final structure.

Figure 5:
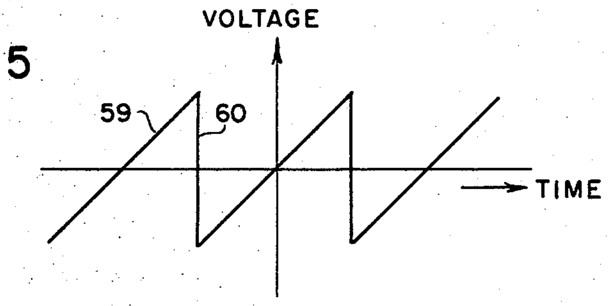
FIGURE 5 is a plot of output voltage versus time for the solid circuit structure of FIGURE 1.

Referring now to FIGURE 5, there is shown the output characteristics of the relaxation oscillator embodiment described in detail herein. In operation, a D.C. bias on capacitor 13 attempts to impose upon the capacitor its particular value of potential, the rate of charging being determined by the time constant, $\tau$, in the RC circuit formed by capacitor 13 and resistor 14. The time constant has its usual significance, being the product of the resistance and the capacitance in the circuit. Since the capacitance of diode 13 decreases with increasing voltage, the $\tau$ decreases as the potential on the capacitor increases. Thus the output voltage of the oscillator during charging, represented by 59 in FIGURE 5, is virtually linear with time.

When the capacitor reaches a charged state corresponding to the firing voltage of the P-N-P-N switch, the switch fires and a continuous current path is present across the outer terminals of the switch. At this point the condenser immediately discharges, the rate of discharge again being determined by the time constant in the circuit during discharge, which is much smaller than the time constant during charging. The result is linearity of the saw-tooth wave output of the oscillator as shown in FIGURE 5 at 60. Typical circuit values wherein an output frequency of 100 cycles/second is obtained include a capacitor of 1000$\mu\omega$. and a resistor of 10,000 ohms.

It will be apparent from the description of the operation of the circuit that the reversed breakdown voltage of the capacitor element should have a magnitude greater than the firing voltage of the switch. Suitably, the reversed breakdown is selected at about 50 volts while the firing voltage is in the reverse of 20 volts.

In accordance with another feature of the invention, the output frequency of the oscillator may be modulated by light means (FIGURE 4) impinging upon the reversed-biased diode resistor 14. Since the resistance of the diode is proportional to the light intensity falling thereon, the time constant of the circuit and accordingly the output signal frequency may be increased by increasing the intensity of the incident light signal.

What has been described herein is a semiconductor solid circuit structure including a plurality of layers of semiconductor material forming active devices. By way of illustration in a relaxation oscillator circuit there is shown a method of forming such structures wherein extraneous device interaction within the layered structure is prevented by the provision of layers having prescribed physical characteristics including thickness and resistivity. As another feature of the invention, there has been described in detail a novel relaxation oscillator having improved output wave characteristics which are linear and whose frequency may be modulated with light.

Although, as above pointed out, the principles in accordance with the present invention have been illustrated by describing particular circuits, many other circuit structures will become apparent to those skilled in the art and, therefore, the scope of the present invention should be limited only by the appended claims.

What is claimed is:

1. A relaxation oscillator semiconductor solid circuit structure comprising a substantially single crystalline base layer of semiconductor material;

four layers of semiconductor material of alternating conductivity type integrally formed on and crystallographically affixed to said base layer, said four layers being divided by a gap formed therein transverse to said base layer and to said four layers into two sections in a manner whereby one of said two sections forms a PNPN switch;

a plurality of additional layers of semiconductor material of alternating conductivity type integrally formed on and crystallographically affixed to the other of said two sections, three of said plurality of additional layers forming a first additional section forming a diode and two of said plurality of additional layers forming a second additional section forming a diode, said first and second additional sections having one of said plurality of additional layers in common and being spaced from each other in their remaining additional layers, said base layer providing a common resistance contact only between said switch and said diodes and the common layer of said diodes providing a common connection for said diodes;

electrical biasing means electrically connected to one of said diodes electrically biasing said one of said diodes as a capacitor;

electrical biasing means electrically connected to the other of said diodes electrically biasing said other of said diodes as a resistor; and means electrically interconnecting said switch and said diodes.

2. A relaxation oscillator semiconductor solid circuit structure as claimed in claim 1, further comprising output means electrically connected to said switch for providing a sawtooth output at a determined frequency and light means postioned in operative proximity with the other of said diodes for impinging light upon said other of said diodes thereby varying the frequency of said sawtooth output.

3. A relaxation oscillator semiconductor solid circuit structure as claimed in claim 1, further comprising electrical biasing means electrically connected to said switch for controlling the conductivity condition of said switch, said one of said diodes having a peak inverse voltage greater than the voltage applied to said switch.

4. A relaxation oscillator semiconductor solid circuit structure as claimed in claim 1, further comprising input means electrically connected to said diodes and output means electrically connected to said switch, and wherein said first-mentioned electrical biasing means reverse-biases said one of said diodes and said last-mentioned electrical biasing means reverse-biases said other of said diodes.

5. A relaxation oscillator semiconductor solid circuit structure comprising a substantially single crystalline base layer of silicon;

four layers of silicon of alternating conductivity type integrally formed on and crystallographically affixed to said base layer, said four layers being divided by a gap formed therein transverse to said base layer and to said four layers into two sections in a manner whereby one of said two sections forms a PNPN switch;

a plurality of additional layers of silicon of alternating conductivity type integrally formed on and crystallographically affixed to the other of two sections, said three of said plurality of additional layers forming a first additional section forming a PN junction diode and two of said plurality of additional layers forming a second additional section forming a PN junction diode, said first and second additional sections having one of said plurality of additional layers in common and being spaced from each other in their remaining additional layers, said base layer providing a common resistance contact only between said switch and said diodes and the common layer of said diodes providing a common connection for said diodes;

electrical biasing means electrically connected to one of said diodes electrically biasing said one of said diodes as a capacitor;

electrical biasing means electrically connected to the other of said diodes electrically biasing said other of said diodes as a resistor; and means electrically interconnecting said switch and said diodes.

References Cited by the Examiner

UNITED STATES PATENTS

| | | | |
|---|---|---|---|
| 2,907,887 | 10/1959 | Beck | 332—3 |
| 3,070,762 | 12/1962 | Evans | 307—88.5 |
| 3,115,581 | 12/1963 | Kilby | 317—234 |
| 3,118,114 | 1/1964 | Barditch | 307—88.5 |

OTHER REFERENCES

PNPN Transistor Switches, by Moll et al., in Proc. of IRE, September 1956, p. 1181.

ROY LAKE, *Primary Examiner.*

JOHN KOMINSKI, *Examiner.*